US012701707B2

(12) United States Patent
Zhang et al.

(10) Patent No.: US 12,701,707 B2
(45) Date of Patent: Aug. 4, 2026

(54) MEMORY DEVICE CONTAINING TSG DECK WITH REDUCED WAFER BOW AND METHOD OF FORMING THE SAME

(71) Applicant: Yangtze Memory Technologies Co., Ltd., Wuhan (CN)

(72) Inventors: Wenbo Zhang, Wuhan (CN); Kai Yu, Wuhan (CN); Zhiyong Lu, Wuhan (CN); Sheng Peng, Wuhan (CN); Zhaohui Cheng, Wuhan (CN); Zhangyi Li, Wuhan (CN); Jing Gao, Wuhan (CN); Zongliang Huo, Wuhan (CN); Lei Xue, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 485 days.

(21) Appl. No.: 18/319,256

(22) Filed: May 17, 2023

(65) Prior Publication Data

US 2024/0224519 A1 Jul. 4, 2024

Related U.S. Application Data

(60) Provisional application No. 63/436,226, filed on Dec. 30, 2022.

(30) Foreign Application Priority Data

Apr. 20, 2023 (CN) .......................... 202310428377.6

(51) Int. Cl.
*H10B 43/27* (2023.01)
*H10B 43/10* (2023.01)
(Continued)

(52) U.S. Cl.
CPC ............. *H10B 43/27* (2023.02); *H10B 43/10* (2023.02); *H10B 43/35* (2023.02); *H10W 20/435* (2026.01)

(58) Field of Classification Search
CPC ........ H10B 53/00; H10B 53/10; H10B 53/20; H10B 53/30; H10B 53/40; H10B 53/50;
(Continued)

(56) References Cited

U.S. PATENT DOCUMENTS

2007/0252201 A1* 11/2007 Kito ........................ H10D 88/00
257/E21.679
2009/0090965 A1* 4/2009 Kito ........................ H10B 43/20
257/326
(Continued)

*Primary Examiner* — William B Partridge
*Assistant Examiner* — Gustavo G Ramallo
(74) *Attorney, Agent, or Firm* — Anova Law Group, PLLC

(57) ABSTRACT

Memory device, memory system, and formation method are provided. The formation method includes providing a dielectric-pair stack containing a channel layer extending there-through, and forming a sacrificial layer in the dielectric-pair stack and in contact with the channel layer; forming a semiconductor layer over the dielectric-pair stack, the semiconductor layer containing a top selective gate (TSG) cut structure; forming a trench through the semiconductor layer to expose the sacrificial layer; forming a barrier layer on sidewalls of the semiconductor layer exposed by the trench; forming a recess by removing the sacrificial layer; and forming a channel plug structure in the trench and the recess.

20 Claims, 14 Drawing Sheets

(51) Int. Cl.
  *H10B 43/35* (2023.01)
  *H10W 20/41* (2026.01)

(58) Field of Classification Search
  CPC ........ H10B 41/00; H10B 41/10; H10B 41/20;
      H10B 41/23; H10B 41/27; H10B 41/30;
      H10B 41/35; H10B 41/40–44; H10B
      41/46–50; H10B 41/60; H10B 41/70;
      H10B 43/00; H10B 43/10; H10B 43/20;
      H10B 43/23; H10B 43/27; H10B 43/30;
      H10B 43/35; H10B 43/40; H10B 43/50;
      H10B 51/00; H10B 51/10; H10B 51/20;
      H10B 51/30; H10B 51/40; H10B 51/50
  See application file for complete search history.

(56) References Cited

U.S. PATENT DOCUMENTS

| | | | |
|---|---|---|---|
| 2009/0121271 A1* | 5/2009 | Son | H10B 43/27 |
| | | | 257/315 |
| 2009/0146190 A1* | 6/2009 | Fukuzumi | H10B 43/50 |
| | | | 257/E27.103 |
| 2020/0365612 A1* | 11/2020 | Hu | H01L 21/76897 |
| 2022/0310515 A1* | 9/2022 | Lee | H10B 43/40 |
| 2022/0399369 A1* | 12/2022 | Son | H10B 41/10 |

* cited by examiner

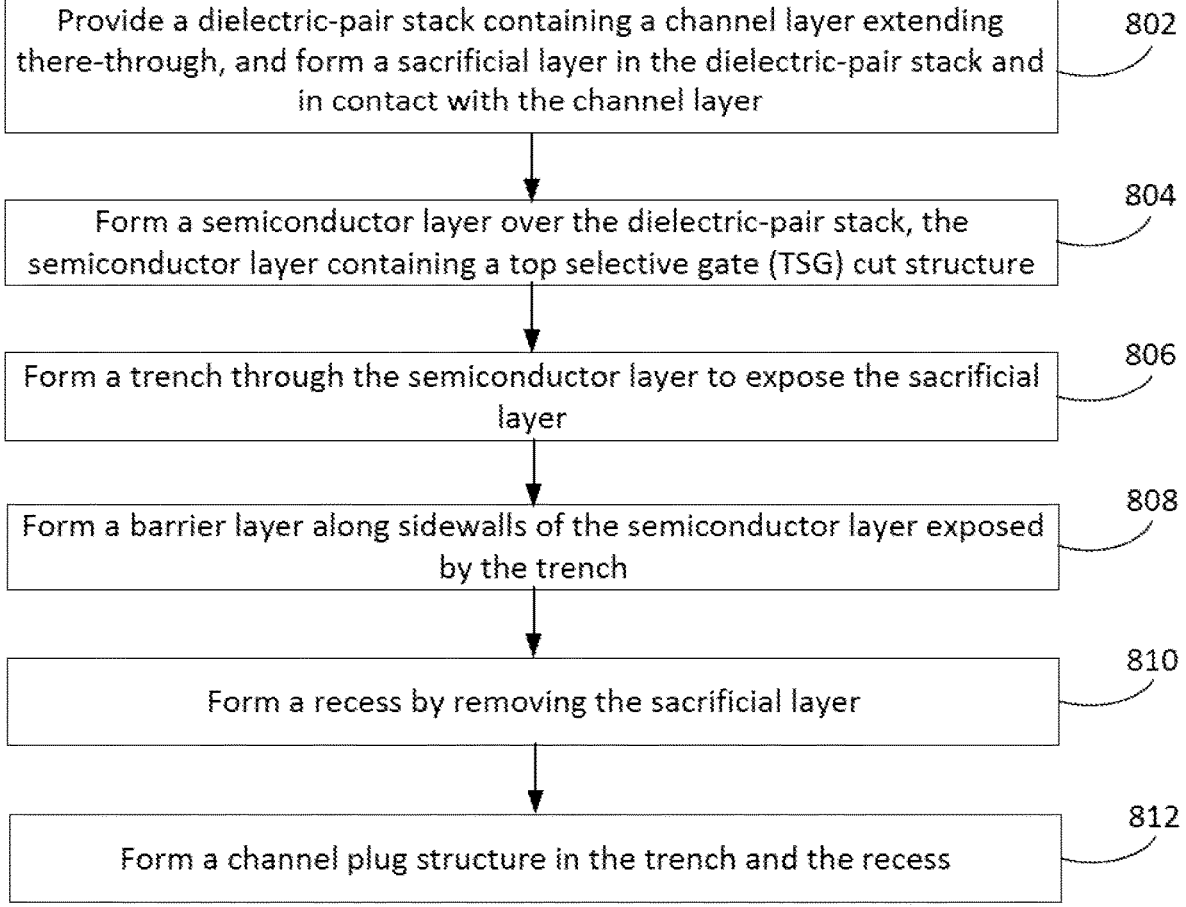

Provide a dielectric-pair stack containing a channel layer extending there-through, and form a sacrificial layer in the dielectric-pair stack and in contact with the channel layer — 802

Form a semiconductor layer over the dielectric-pair stack, the semiconductor layer containing a top selective gate (TSG) cut structure — 804

Form a trench through the semiconductor layer to expose the sacrificial layer — 806

Form a barrier layer along sidewalls of the semiconductor layer exposed by the trench — 808

Form a recess by removing the sacrificial layer — 810

Form a channel plug structure in the trench and the recess — 812

MEMORY DEVICE CONTAINING TSG DECK WITH REDUCED WAFER BOW AND METHOD OF FORMING THE SAME

CROSS-REFERENCE TO RELATED APPLICATIONS

This application claims the priority of Provisional Patent Application No. 63/436,226, filed on Dec. 30, 2022, and the priority of Chinese Application No. 202310428377.6, filed on Apr. 20, 2023, the contents of which are incorporated herein by reference in their entirety.

FIELD OF THE DISCLOSURE

The present disclosure generally relates to the field of memory device and, more particularly, relates to memory device, memory system, and formation method thereof.

BACKGROUND

A three-dimensional (3D) memory architecture can address the density limitation in planar memory cells. As semiconductor technology advances, for 3D memory devices, such as 3D NAND memory devices, it is desirable to reduce die size along bit line direction of the 3D memory device to improve the area utilization of wafers. However, it is a challenge to reduce die size without changing the storage capacity.

The disclosed devices and methods are directed to solve one or more problems set forth above and other problems in the art.

BRIEF SUMMARY OF THE DISCLOSURE

One aspect of the present disclosure provides a method for forming a memory device. The method includes providing a dielectric-pair stack containing a channel layer extending there-through, and forming a sacrificial layer in the dielectric-pair stack and in contact with the channel layer; forming a semiconductor layer over the dielectric-pair stack, the semiconductor layer containing a top selective gate (TSG) cut structure; forming a trench through the semiconductor layer to expose the sacrificial layer; forming a barrier layer on sidewalls of the semiconductor layer exposed by the trench; forming a recess by removing the sacrificial layer; and forming a channel plug structure in the trench and the recess.

In some embodiments, the channel plug structure includes an upper plug portion formed in the trench and a lower plug portion formed in the recess, and at an interface between the upper and lower plug portions, the upper plug portion includes a width less than the lower plug portion.

In some embodiments, the sacrificial layer is formed in the dielectric-pair stack either having a sidewall surrounded by the channel layer or having a bottom surface over the channel layer.

In some embodiments, forming the barrier layer includes performing an oxidation process to convert a portion of the sidewalls of the semiconductor layer exposed by the trench into the barrier layer; or depositing the barrier layer selectively on the sidewalls of the semiconductor layer exposed by the trench.

In some embodiments, a deck structure is formed over the dielectric-pair stack, the deck structure including: a dielectric layer, a deck cap layer; and the semiconductor layer, the barrier layer, and the TSG cut structure, that are between the dielectric layer and the deck cap layer.

In some embodiments, the top selective gate (TSG) cut structure separates from the dielectric-pair stack by a dielectric layer over the dielectric-pair stack.

In some embodiments, forming the channel plug structure further includes forming an airgap in a portion of the channel plug structure under the semiconductor layer.

In some embodiments, the channel plug structure includes an upper plug portion formed in the trench and a lower plug portion formed in the recess, and the TSG cut structure is formed between the upper plug portion of the channel plug structure and an adjacent upper plug portion of an adjacent channel plug structure along a lateral direction of the semiconductor layer.

In some embodiments, the method further includes forming slits through the dielectric-pair stack; replacing one dielectric layer of the dielectric-pair stack with a conductor layer to form a layer stack including alternating layers of a conductor layer and another dielectric layer; and forming slit structures in the slits extending through the layer stack.

In some embodiments, the TSG cut structure is made of a material including a dielectric layer, and the channel plug structure is made of a material including polysilicon.

Another aspect of the present disclosure provides a memory device. The memory device includes a stack structure; a semiconductor layer over the stack structure and containing a top selective gate (TSG) cut structure; a channel plug structure passing through the semiconductor layer, and penetrating into the stack structure and in contact with a channel layer, the channel layer extending through the stack structure; and a barrier layer through the semiconductor layer and separating the channel plug structure from the semiconductor layer along a lateral direction of the semiconductor layer.

In some embodiments, the memory device further includes a deck structure. The deck structure includes a dielectric layer over the stack structure, a deck cap layer, and the semiconductor layer between the dielectric layer and the deck cap layer. The barrier layer has a surface coplanar with each of sidewall surfaces of the dielectric layer and the deck cap layer along a sidewall of the channel plug structure.

In some embodiments, the channel plug structure includes an upper plug portion through the semiconductor layer and a lower plug portion in the stack structure, and at an interface between the upper and lower plug portions, the upper plug portion includes a width less than the lower plug portion.

In some embodiments, a lower plug portion of the channel plug structure is in contact with the channel layer, and the lower plug portion includes a sidewall surrounded by the channel layer or includes a bottom surface on the channel layer.

In some embodiments, a channel structure extends through the stack structure and includes a functional layer between the channel layer and the stack structure. The functional layer includes a tunneling layer adjacent to the channel layer, a blocking layer adjacent to the stack structure, and a charge trap layer between the blocking layer and the tunneling layer. A lower plug portion of the channel plug structure is formed above the channel layer and the tunneling layer, and further surrounded by the charge trap layer.

In some embodiments, the TSG cut structure is between the upper plug portion of the channel plug structure and an adjacent upper plug portion of an adjacent channel plug structure along the lateral direction of the semiconductor layer.

In some embodiments, the channel plug structure contains an airgap under the deck structure.

In some embodiments, the stack structure includes a dielectric-pair stack or a stack structure including alternating layers of a conductor layer and a dielectric layer.

In some embodiments, slit structures extend through the stack structure and are laterally arranged in parallel. The TSG cut structure is in parallel with the slit structures laterally and separates a plurality of channel plug structures configured between the slit structures into groups.

Another aspect of the present disclosure provides a memory system. The memory system includes a controller and a memory device. The a memory device includes a stack structure; a semiconductor layer over the stack structure and containing a top selective gate (TSG) cut structure; a channel plug structure passing through the semiconductor layer, and penetrating into the stack structure and in contact with a channel layer, the channel layer extending through the stack structure; and a barrier layer through the semiconductor layer and separating the channel plug structure from the semiconductor layer along a lateral direction of the semiconductor layer. The controller is configured to control the memory device.

Other aspects of the present disclosure may be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

FIGS. 1-6 and 7A-7C illustrate a cross-section view of an exemplary memory device at various fabrication stages consistent with various disclosed embodiments of the present disclosure.

FIG. 8 illustrates an exemplary method for forming a memory device consistent with various disclosed embodiments of the present disclosure.

DETAILED DESCRIPTION

Figure 1:
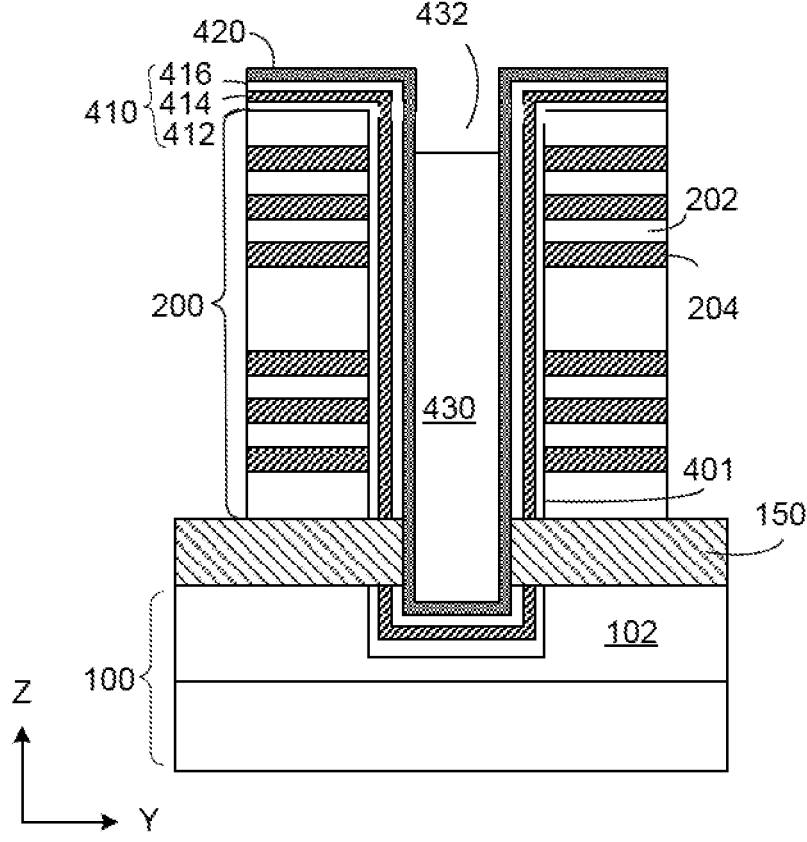

Reference will now be made in detail to exemplary embodiments of the present disclosure, which are illustrated in the accompanying drawings. Wherever possible, the same reference numbers will be used throughout the drawings to refer to the same or like parts.

For illustrative purposes, specific configurations and arrangements are described herein, and a person skilled in the pertinent art should understand that other configurations and arrangements without departing from the spirit and scope of the present disclosure are also encompassed within the scope of the present disclosure. It will be apparent to a person skilled in the pertinent art that the present disclosure can also be employed in a variety of other applications.

It should be noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain un-patterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend laterally, vertically, and/or along a tapered surface. A substrate can be a layer, can include one or more layers therein, and/or can include one or more layer thereupon, there-above, and/or there-below. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "memory device" or "3D memory device" refers to a semiconductor device at least including vertically oriented strings of memory cell transistors (referred to herein as "memory cell strings," such as NAND strings) disposed over a laterally oriented substrate so that the memory cell strings extend in the vertical direction with respect to a lateral surface of the substrate.

As used herein, the term "vertical/vertically" means nominally perpendicular to the lateral surface of a substrate. Accordingly, a lateral direction of the substrate is along the lateral surface of the substrate, and a vertical direction is substantially perpendicular to the lateral surface (or a lateral direction) of the substrate of a memory device.

For example, a lateral direction may refer to X-direction and/or Y-direction in X-Y plane of the lateral surface of the substrate of the memory device. A vertical direction may refer to Z-direction with respect to the X-Y plane of the lateral surface of the substrate.

In a memory device or a 3D memory device, such as a 3D NAND memory device or a NAND Flash memory device, the x-direction may be the word line direction of the 3D memory device, and the y-direction may be the bit line direction of 3D memory device. The memory device may include staircase structures arranged in the x-direction of memory array structure. Each word line extends laterally in the x-direction across a memory plane to a respective stair (level) in staircase structure.

The present disclosure provides memory device, memory system, memory card, and method of forming the same.

For example, FIGS. 1-6 and 7A-7C illustrate a cross-section view of an exemplary memory device at various fabrication stages consistent with various disclosed embodiments of the present disclosure; and FIG. 8 illustrates an exemplary method for forming a memory device consistent with various disclosed embodiments of the present disclosure.

As illustrated in FIG. 8, at 802, a dielectric-pair stack may be provided including a channel layer extending through the dielectric-pair stack. A sacrificial layer is formed in the dielectric-pair stack and in contact with the channel layer. In some embodiments, corresponding structures are illustrated in FIGS. 1-2.

Figure 2:
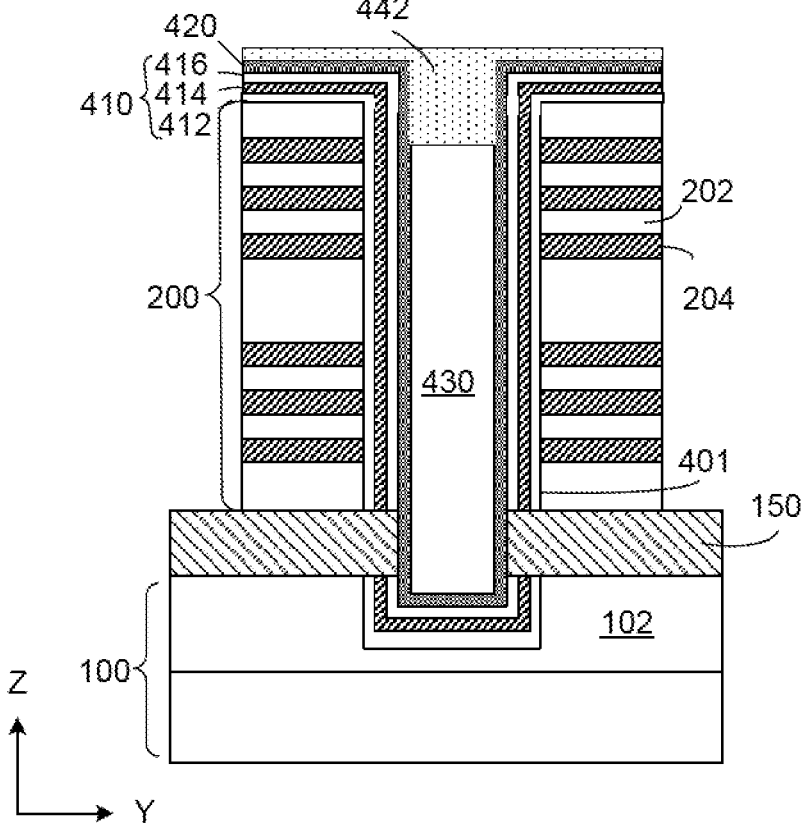

Referring to FIG. 1, memory device may include a substrate 100. In some embodiments, the substrate 100 may be made of a material including single crystalline silicon, germanium (Ge), silicon-germanium (SiGe), silicon carbide (SiC), silicon-on-insulator (SOI), germanium-on-insulator (GOI), polysilicon, and/or a Group III-V compound such as gallium arsenide (GaAs) or indium phosphide (InP). In some embodiments, the substrate 100 may include an electrically non-conductive material such as glass, a plastic material, or a ceramic material, and may further include a thin layer of polysilicon deposited on the non-conductive material.

In one embodiment, the substrate 100 may be an undoped or lightly doped single crystalline silicon layer. The substrate 100 may be doped differently with p-type or n-type dopants. For example, a doped region 102 may be formed in the substrate 100, e.g., in a top portion of the substrate 100, by doping suitable dopants (e.g., n-type dopants) via ion implantation and/or diffusion. The dopants of the doped region 102 may include, for example, phosphorus (P), arsenic (As), and/or antimony (Sb). The doping of the substrate may be in the thickness direction and/or the width direction. The silicon substrate may be a thinned silicon substrate, e.g., a thinned single crystalline silicon layer. In some embodiments, the single crystalline silicon layer may have a thickness between 200 nm to 50 μm. In some embodiments, the single crystalline silicon layer has a thickness between 500 nm to 5 μm. The single crystalline silicon layer may be partially or fully doped with n-type and/or p-type dopants.

In some embodiments, the memory device may not include any substrate, but rather include a semiconductor layer same or different than the substrate 100. In one embodiment, the semiconductor layer may be a layer containing polysilicon or another different semiconductor material.

A dielectric-pair stack 200 may be formed over the substrate 100. The dielectric-pair stack 200 may include alternating layers of dielectric materials. In one embodiment, the dielectric-pair stack 200 may include dielectric-pairs stacked one over another. A dielectric-pair may include a first dielectric layer 202 (e.g., silicon oxide) and a second dielectric layer 204 (e.g., silicon nitride) that is different from first dielectric layer 202. For example, the first dielectric layers 202 and second dielectric layers 204 may be extended in a lateral direction that is parallel to the surface of the substrate 100. The dielectric-pair stack 200 can be formed by one or more thin film deposition processes including, but not limited to, chemical vapor deposition (CVD), physical vapor deposition (PVD), atomic layer deposition (ALD), or any combination thereof.

In some embodiments, the dielectric-pair stack 200 can include a plurality of silicon oxide/nitride layer pairs. Each dielectric-pair includes a layer of silicon oxide 202 and a layer of silicon nitride 204. The plurality of oxide/nitride layer pairs are also referred to herein as an "alternating oxide/nitride stack." For example, in the dielectric-pair stack 200, multiple oxide layers 202 and multiple nitride layers 204 alternate in a vertical direction. In other words, except a top and a bottom layer of a given alternating oxide/nitride stack, each of the other oxide layers 202 can be sandwiched by two adjacent nitride layers 204, and each of the nitride layers 204 can be sandwiched by two adjacent oxide layers 202.

Oxide layers can each have the same thickness or have different thicknesses. For example, thickness of the oxide layer may be in a range from 10 nm to 100 nm, e.g., about 25 nm. Nitride layers can each have the same thickness or have different thicknesses. For example, thickness of the nitride layer can be in a range from 10 nm to 100 nm, e.g., about 35 nm.

According to various embodiments of the present disclosure, the oxide layers 202 and/or nitride layers 204 may include any suitable oxide materials and/or nitride materials. For example, the oxide materials may include silicides, and the element of nitride materials may include, but is not limited to, tungsten (W), cobalt (Co), copper (Cu), aluminum (Al), doped silicon, silicides, or any combination thereof. In some embodiments, the oxide layers can be silicon oxide layers, and the nitride layers can be silicon nitride layer.

The dielectric-pair stack 200 can include any suitable number of layers of the oxide layers 202 and the nitride layers 204. In some embodiments, a total number of layers of the oxide layers 202 and the nitride layers 204 in the dielectric-pair stack 200 is equal to or greater than 64. For example, number of oxide/nitride layer pairs can be equal to or larger than 32. In some embodiments, the alternating oxide/nitride stack 200 includes more oxide layers or more nitride layers with different materials and/or thicknesses than the oxide/nitride layer pair.

In some embodiments, the oxide layer may be used as an isolation layer and the nitride layer may be used as a sacrificial layer. The sacrificial layers may be subsequently removed and replaced by conductor layers, e.g., made of an electrically conductive material.

In some embodiments, a channel structure can be formed extending through the dielectric-pair stack 200 and partially penetrating the doped region 102 in the substrate 100. The channel structure can be formed by forming a channel hole 401 extending through the dielectric-pair stack 200 and into the doped region 102 in the substrate 100, followed by filling desired materials/structures in the channel hole 401.

The channel hole 401 may be formed extending in the Z direction or in a direction approximately perpendicular (e.g., vertically) to a surface of the substrate 100. The channel hole 401 may be formed by, e.g., a dry etch process or a combination of dry and wet etch processes. Other fabrication processes may also be performed, such as a patterning process involving lithography, cleaning, and/or chemical mechanical polishing (CMP). Channel hole 401 may include any desirable shape, e.g., a cylinder shape or pillar shape.

After the channel hole 401 is formed, a functional layer 410 may be formed on the sidewall and bottom of the channel hole 401, and further over top surface of the dielectric-pair stack 200. The functional layer 410 may include a blocking layer 412, a charge trap layer 414, and a tunneling layer 416.

The blocking layer 412 may be formed on the sidewall and bottom of the channel hole 401 and on a top surface of the dielectric-pair stack 200. The blocking layer 412 may be formed to block an outflow of charges. The blocking layer 412 may include one or more layers formed by one or more materials. The material for the blocking layer 412 may include silicon oxide, silicon nitride, silicon oxynitride, a high-k dielectric material (such as aluminum oxide or hafnium oxide), a wide bandgap material, etc. In one example, the blocking layer 412 may be an oxide layer formed by in-situ steam generation (ISSG) oxidation after a silicon nitride deposition process. In some embodiments, a thickness of the blocking layer 412 may be less than 20 nm.

The charge trap layer 414 may be formed over the blocking layer 412 to store electronic charges during an operation of the memory device. The storage and/or removal of charges in the charge trap layer 414 can impact the on/off state and/or a conductance of, e.g., the channel layer. The charge trap layer 414 may include one or more layers made of one or more materials. The materials for the charge trap layer 414 may include polysilicon, silicon nitride, silicon oxynitride, nanocrystalline silicon, a wide bandgap material, etc. In some embodiments, the charge trap layer 414 may include a nitride layer formed by a suitable deposition process.

The tunneling layer 416 may be formed over the charge trap layer 414 for tunneling electronic charges (e.g., electrons or holes). The tunneling layer 416 may include one or more layers made of one or more materials. The material for the tunneling layer 416 may include silicon oxide, silicon nitride, silicon oxynitride, a high-k dielectric material (such as aluminum oxide or hafnium oxide), a wide bandgap material, etc.

In some embodiments, the functional layer 410 may include an oxide-nitride-oxide (ONO) structure. For example, the functional layer 410 may include a silicon oxide layer for the blocking layer 412, a silicon nitride layer for the charge trap layer 414, and another silicon oxide layer for the tunneling layer 416, although any suitable structure different from the ONO configuration can be formed for the functional layer 410 according to various embodiments of the present disclosure.

The channel structure further includes a channel layer 420 formed over the tunneling layer 416 in the channel hole 401. In one embodiment, the channel layer 420 may be referred to as a "semiconductor channel." For example, the channel structure may be, e.g., a polysilicon layer. In another embodiment, the channel layer 420 may include amorphous silicon or single crystalline silicon.

The functional layer 410 may be formed between the dielectric-pair stack 200 and the channel layer 420. The channel layer 420 and each of the blocking layer 412, the charge trap layer 414, and the tunneling layer 416 may be formed by, e.g., CVD, PVD, ALD, or a combination thereof.

The channel structure may further include a dielectric filling material 430 formed over the channel layer 420 to at least partially fill the channel hole 401.

Referring back to FIG. 1, a semiconductor layer 150 may be formed between the substrate 100 and the dielectric-pair stack 200 along a vertical direction with respect to the substrate 100. The channel layer 420 may pass through the semiconductor layer 150, e.g., having a portion of side wall of the channel layer 420 physically connected to the semiconductor layer 150, while a portion of the channel structure, e.g., including a portion of each of the functional layer 410, the channel layer 420, and the dielectric filling material 430, may be formed in the doped region 102 of the substrate 100 and may be separated with their other portions by the semiconductor layer 150.

In one embodiment, the semiconductor layer 150 may be formed by forming a sacrificial layer over the substrate 100, followed by forming the dielectric-pair stack 200. In some embodiments, slits (e.g., gate line slits) may be formed extending through the dielectric-pair stack 200 exposing the sacrificial layer. The sacrificial layer, along with a portion of the functional layer, may then be removed to form a cavity, which may then be filled with a semiconductor material (e.g., polysilicon) to form the semiconductor layer 150. In one embodiment, the semiconductor layer 150 may be doped. The semiconductor layer 150 may be formed on the exposed surface of the doped region 102 and on the portion of side wall of the channel layers 420. The semiconductor layer 150 may be electrically connected to the doped region 102 and the channel layers 420. Slit structures (e.g., slit structure 600 shown in FIG. 9) may be subsequently formed in the slits.

In some embodiments, a selective epitaxial growth may be performed such that a layer of single crystalline silicon is grown on the exposed surface of the doped region 102 and a polysilicon layer is grown on the exposed surface of the channel layer 420. As such, the semiconductor layer 150 may include adjoined layers of single crystalline silicon and polysilicon according to various embodiments of the present disclosure.

The dielectric filling material 430 may be formed over the channel layer 420 to partially fill the remaining space of the channel hole 401 using one or more thin film deposition processes, such as CVD, PVD, ALD, electroplating, electroless plating, or any combination thereof.

The dielectric filling material 430 may have a top surface lower than a top surface of the dielectric-pair stack 200, thereby forming an opening 432 over the dielectric filling material 430 in the channel hole 401. The dielectric filling material 430 may be formed by multiple processes, for example, a deposition process, such as an atomic layer deposition (ALD) process, followed by an etching back process (e.g., wet and/or dry etch), to thus form the opening 432. In one embodiment, the dielectric filling material 430 may include a lower portion, formed by a first ALD process and a first etch back process, and an upper portion formed by a second ALD process and a second etch back process. In some embodiments, one or more airgaps may be formed in the lower portion of the dielectric filling material 430, e.g., to avoid wafer bowing. The dielectric filling material 430 may include any suitable dielectric material, such as silicon oxide. In some embodiments, a diluted hydrofluoric acid (HF) cleaning process can be performed to clean the opening 432.

Referring to FIG. 2, a sacrificial layer 442 may be formed to fill the opening 432 and further formed above the dielectric-pair stack 200. The sacrificial layer 442 may be in contact with the channel layer 420.

Figure 4:
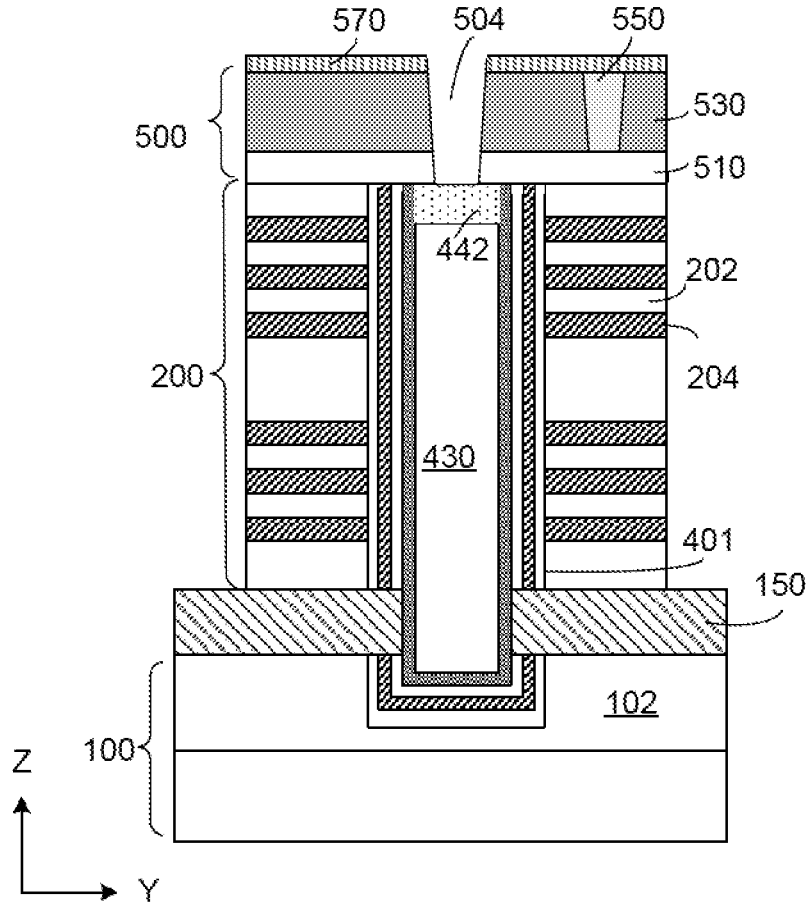

The sacrificial layer 442 may include any suitable semiconductor or conductive materials that can be used as an etch stop layer during a subsequent etch process on a TSG (top select gate) deck structure (e.g., referring to structure 500 in FIGS. 4-6), and that can be removed by any suitable etch process, e.g., an isotropic wet etch. The materials selected for the sacrificial layer 442 can allow a sufficiently high etching selectivity over material(s) that are subsequently formed in the TSG deck structure. For example, when subsequently forming a trench over the sacrificial layer 442 and through the TSG deck structure (e.g., as shown in FIG. 4), the sacrificial layer 442 may be used as an etch stop layer.

The sacrificial layer 442 may include any nitride material, e.g., element of the nitride material may include silicon or doped silicon (e.g., SiN), tantalum (e.g., TaN), tungsten (e.g., WN), cobalt (Co), copper (Cu), aluminum (Al), silicide (e.g., tungsten silicide (WSi)), or any combination thereof. Any other suitable materials, such as carbon and $Al_2O_3$, may be used for the sacrificial layer 442. The sacrificial layer 442 may formed by any suitable deposition process(es), such as ALD, CVD, PVD, etc.

Referring back to FIG. 8, at 804, a semiconductor layer is formed over the dielectric-pair stack, the semiconductor layer containing a top selective gate (TSG) cut structure. In some embodiments, FIG. 3 illustrates a corresponding structure.

Figure 3:
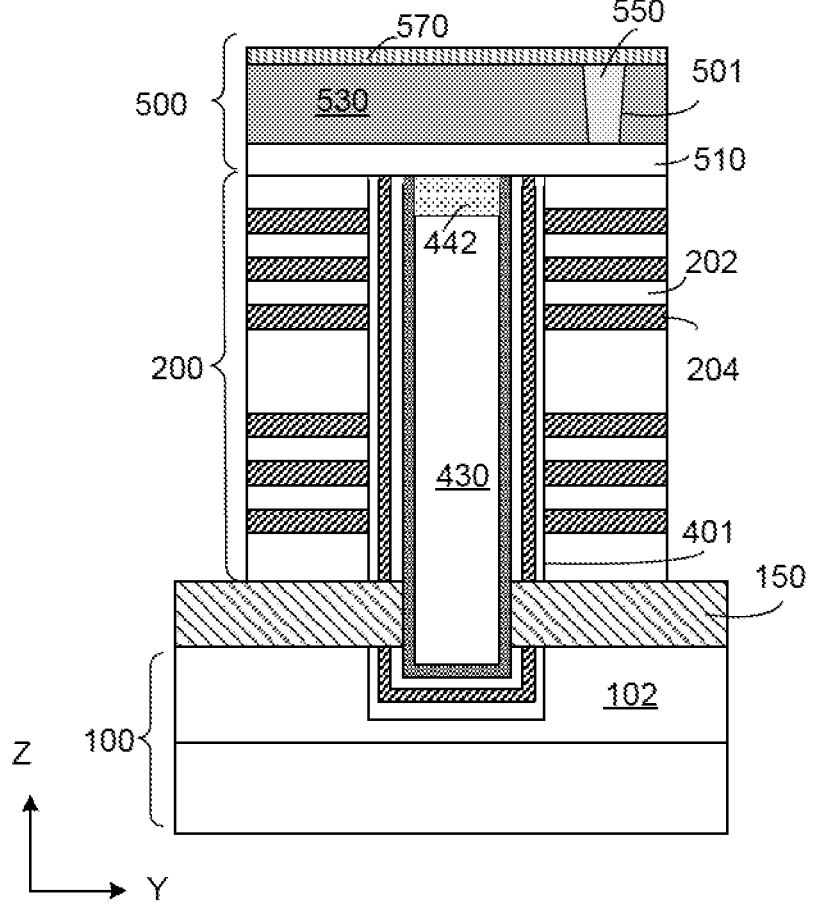

As illustrated in FIG. 3, a portion of each of the sacrificial layer 442, the functional layer 410, and the channel layer 420 that is above the dielectric-pair stack 200 may be removed. Any suitable wet/dry etch process and/or a chemical mechanical polishing (CMP) process may be used for the removal to expose a top surface of the sacrificial layer 442 and the top surface of the dielectric-pair stack 200. The top surface of the sacrificial layer 442 may be coplanar with the top surface of the dielectric-pair stack 200.

Still in FIG. 3, a deck structure 500, such as a TSG deck structure, may be formed on the exposed top surfaces of the sacrificial layer 442 and the dielectric-pair stack 200. For example, the deck structure 500 may include a dielectric layer 510, a semiconductor layer 530, a cut structure 550, such as a TSG cut structure, and a deck cap layer 570.

The dielectric layer 510 may be formed over the sacrificial layer 442 and the dielectric-pair stack 200. Any suitable dielectric materials can be used for forming the dielectric layer 510. For example, the dielectric layer 510 may include an oxide layer, such as a silicon oxide layer.

The semiconductor layer 530, also referred to as deck semiconductor layer, may be formed over the dielectric layer 510. Any suitable materials can be used for forming the semiconductor layer 530. For example, the semiconductor layer 530 can be made of polysilicon. In one embodiment, the semiconductor layer 530 may be doped, e.g., by an ion implantation process.

The TSG cut structure 550 may be formed through the semiconductor layer 530 over dielectric layer 510 that is over the dielectric-pair stack 200. The TSG cut structure 550 may be formed by forming a TSG cut 501 (e.g., a through-hole) passing through an entire thickness of the semiconductor layer 530 over dielectric layer 510, and filling the TSG cut 501 with any desired materials/structures.

In some embodiments, the TSG cut 501 may have inclined sidewalls as shown in FIG. 3. In some other embodiments, the TSG cut 501 may have substantially vertical sidewalls. The TSG cut 501 may have various cross-sections in the x-y plane, and may have a narrower width along the y-direction, compared with the width of the channel hole 401.

In one embodiment, dielectric materials may be used to fill the TSG cut 501 to form the TSG cut structure 550. In another embodiment, the TSG cut structure 550 may include similar structures (e.g., including a functional layer, a channel layer, and a dielectric filling material) as for the channel structure formed in the channel hole 401.

The deck cap layer 570 may be formed over the semiconductor layer 530 and the TSG cut structure 550. The deck cap layer 570 may be used as a stop layer (e.g., a reaction strop layer) for subsequently forming a barrier layer (e.g., a barrier layer 542 in FIG. 5) in the semiconductor layer 530. In some embodiments, the deck cap layer 570 may be made of a material including silicon nitride (SiN), silicon carbide (SiC), nitrogen-doped silicon carbide (NDC), and/or silicon carbonitride (SiCN). In some embodiments, the deck cap layer 570 may be deposited using a CVD process, a spin-on process, or other suitable process.

Referring back to FIG. 8, at 806, a trench may be formed through the semiconductor layer to expose the sacrificial layer. In some embodiments, FIG. 4 illustrates a corresponding structure.

Referring to FIG. 4, a trench 504 may be formed passing through the TSG deck structure 500, e.g., passing through each of the deck cap layer 570, the semiconductor layer 530, the dielectric layer 510, to at least partially expose a surface of the sacrificial layer 442.

The trench 504 may be formed by patterning the deck cap layer 570 using photolithographic process (e.g., using a patterned photoresist layer) and then using the patterned deck cap layer as etch mask to etch each of the semiconductor layer 530, the dielectric layer 510, to at least partially expose the sacrificial layer 442, by one or more etch processes including a dry etch process, a wet etch process, or a combination thereof. The patterned deck cap layer 570 may protect the semiconductor layer 530 from being damaged during the etch process for forming the trench 504.

In some embodiments, the trench 504 may have inclined sidewalls as shown in FIG. 4. However, embodiments of the disclosure are not limited thereto. In some other embodiments, the trench 504 may have substantially vertical sidewalls.

In an exemplary embodiment, formation of the trench 504 can be controlled without exposing any portion of the channel layer 420. For example, regardless of the shape of the sidewall(s) and/or size changes of the width of the trench 504 along a thickness direction over the substrate 100, the trench 504 may only expose surface of the sacrificial layer 442 and may not expose any portion of the channel layer 420. In this manner, when forming the trench 504 by a suitable etching process, the channel layer 420 will not be exposed to the etching process, thereby avoiding damages to the channel layer 420. The channel layer 420 may be covered and protected by the dielectric layer 510 when the trench 504 is formed.

Referring back to FIG. 8, at 808, a barrier layer may be formed along sidewalls of the semiconductor layer exposed by the trench. In some embodiments, FIG. 5 illustrates a corresponding structure.

Figure 5:
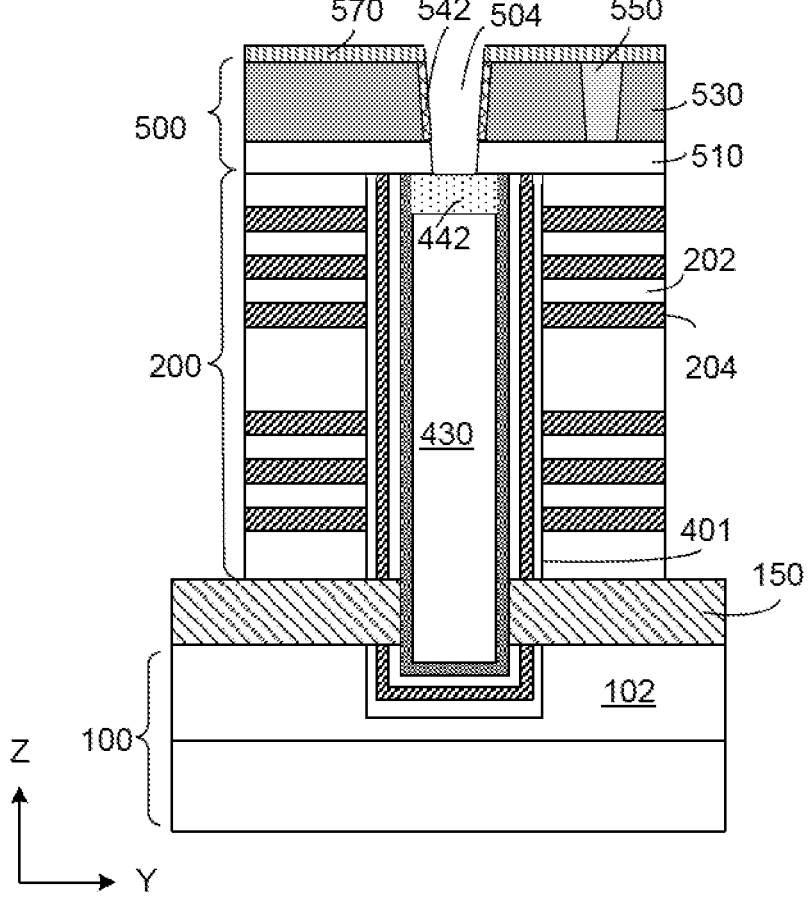

Referring to FIG. 5, a barrier layer 542 may be selectively formed on/into sidewalls of the trench 504 between the dielectric layer 510 and the semiconductor layer 530 to substantially cover the sidewalls of the semiconductor layer 530 exposed to the trench 504.

In one embodiment, the barrier layer 542 may be formed by a dielectric material, which may have a high etch selectivity over the material used for the sacrificial layer 442 during a subsequent removal process of the sacrificial layer 442.

Any suitable process(es) may be used to form the barrier layer 542, including but not limited to a deposition process, a selective oxidation process, etc. The deposition process may include, for example, CVD, PVD, and/or ALD, to form the barrier layer 542 selectively on the sidewall of the semiconductor layer 530, for example, without being formed on the exposed deck cap layer 570 or dielectric layer 510. The selective oxidation process may include a thermal oxidation, a wet oxidation, etc., to form the barrier layer 542 by converting an outer portion of the sidewall of the semiconductor layer 530 into the barrier layer 542.

For example, the barrier layer 542 may include a silicon oxide layer and may be formed by a selective oxidation process of the material of the semiconductor layer 530, e.g., by a wet oxidation process of a portion of the sidewalls of the semiconductor layer 530.

The wet oxidation process may include a flash vaporizer oxidation, a pyrogenic oxidation, a deionized (DI) water bubbler oxidation at any suitable temperature. For example, the material of the semiconductor layer 530, such as silicon material, may be treated by low temperature wet oxidation processing (e.g., using deionized water/ozone) such that the material is highly oxidized and contains substantially no voids. Other oxidation methods may be used to form the barrier layer 542, e.g., a dry oxidation (such as a remote plasma oxidation), a thermal oxidation, etc.

The barrier layer 542 may be formed having a thickness of about 50 angstroms to about 500 nm, e.g., a thickness of about 1 nm or 100 nm.

In one embodiment, the barrier layer 542 may have a surface coplanar with the sidewall surfaces of the deck cap layer 570 and the dielectric layer 510 exposed by the trench 504. In other embodiments, the barrier layer 542 may have a surface protruding over the sidewall surfaces of the deck cap layer 570 and the dielectric layer 510 exposed by the trench 504. For example, the barrier layer 542 may be formed by forming an additional material layer selectively formed over the surface of the semiconductor layer 530 exposed by the sidewalls of the trench 504 between the deck cap layer 570 and the dielectric layer 510.

When forming the barrier layer 542, the sacrificial layer 442 may or may not incur any reactions, provided that a high etch selectivity is ensured between the barrier layer 542 (as well as the dielectric layer 510 and the deck cap layer 570) and the sacrificial layer 442 during the subsequent removal of the sacrificial layer 442. The barrier layer 542 may thus also be used as a protective layer over the semiconductor layer 530.

Referring back to FIG. 8, at 810, a recess may be formed by removing the sacrificial layer. In some embodiments, FIG. 6 illustrates a corresponding structure.

Figure 6:
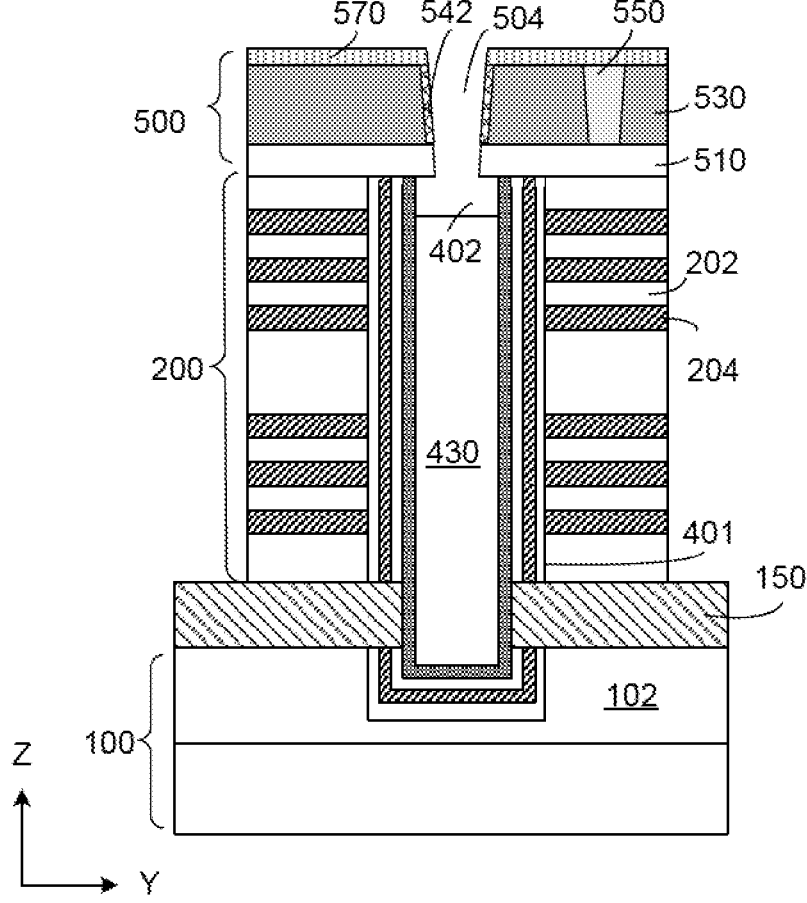

Referring to FIG. 6, the sacrificial layer 442 may be removed from above the dielectric filling material 430 to form a recess 402 above the dielectric filling material 430 in the channel hole 401 and under the TSG deck structure 500.

Depending on the material of the sacrificial layer 442, any suitable methods can be used to remove the sacrificial layer 442 to form the recess 402 under the TSG deck structure 500. For example, the sacrificial layer 442 may be removed by a wet etch process (e.g., using phosphoric acid as an etchant) and/or a drying etch process (e.g., a plasma etch process). In some cases, an ashing process may be used to remove the sacrificial layer 442.

Referring back to FIG. 8, at 812, a channel plug structure may be formed in the trench and the recess. In some embodiments, FIGS. 7A-7C illustrates a corresponding structure.

Figure 7A:
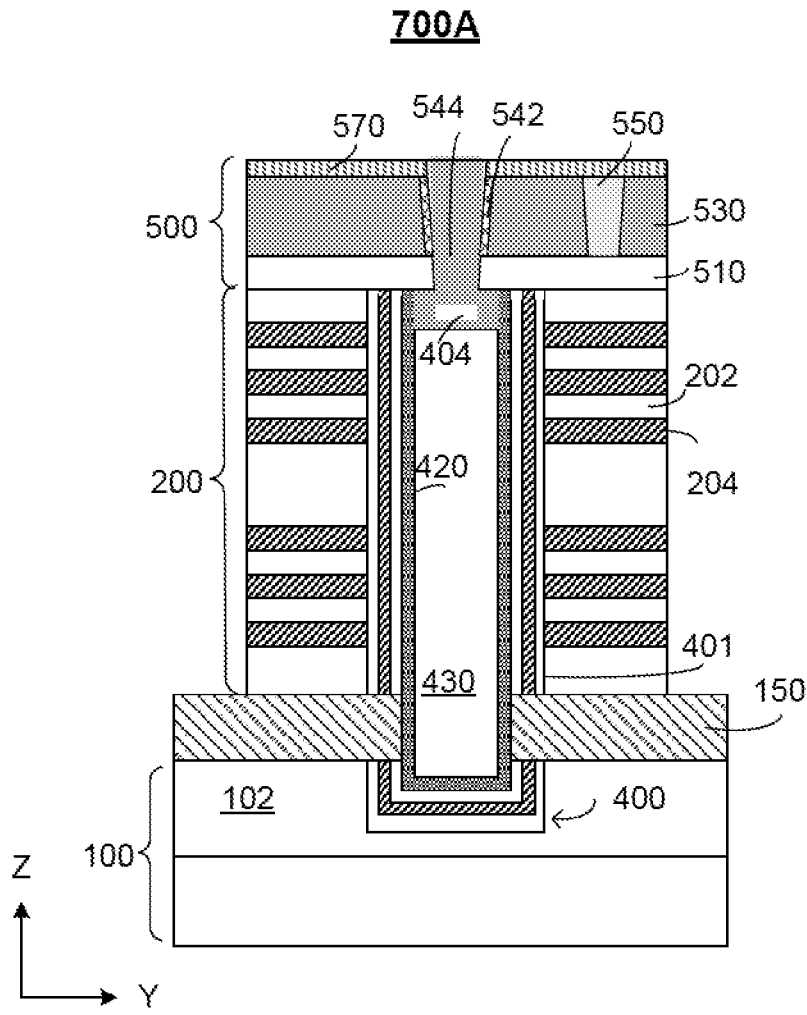
Figure 7B:
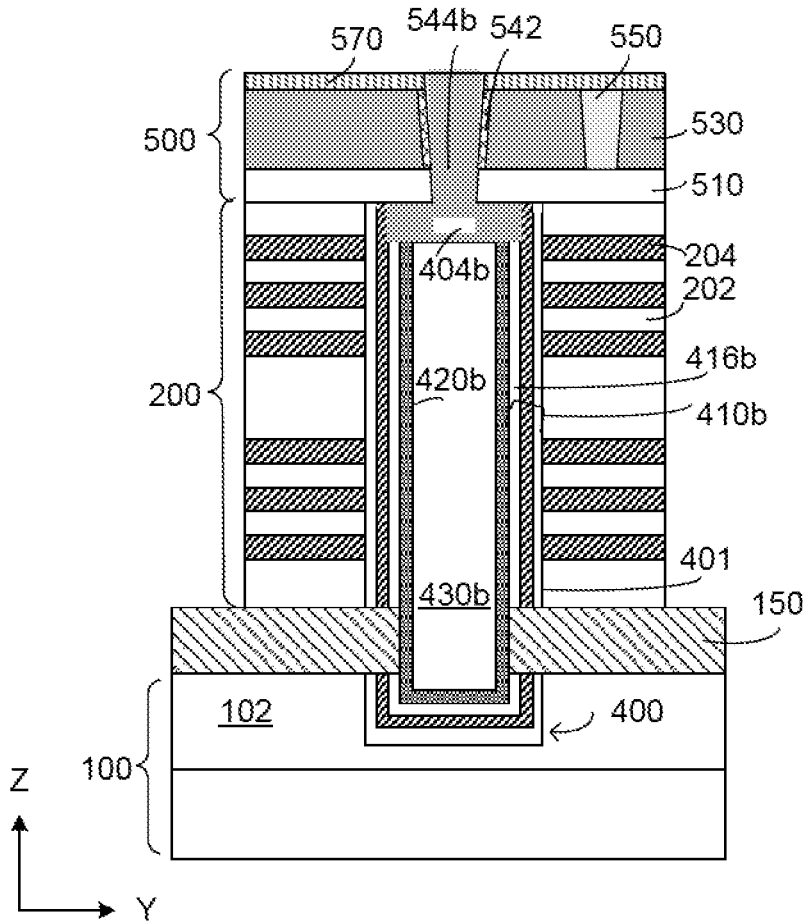
Figure 7C:
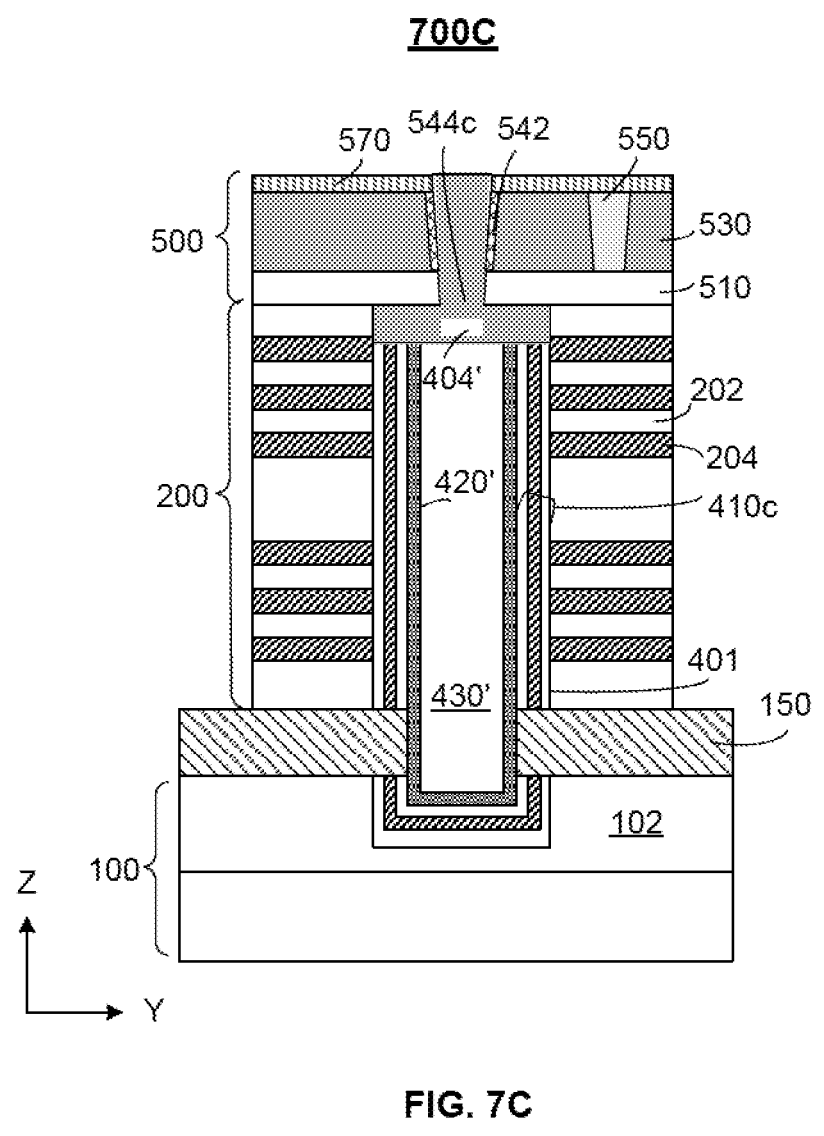

FIG. 7A illustrates an exemplary memory structure 700A. The memory structure 700A may include a plug structure 544 (also referred to as channel plug structure). The plug structure 544 may be formed in the recess 402 surrounded by the dielectric filling material 430 and the channel layer 420, and further in the trench 504 in the TSG deck structure 500. For example, the plug structure 544 may be formed on the exposed surface of the dielectric filling material 430, the channel layer 420, the dielectric layer 510, the barrier layer 542, and the deck cap layer 570 to fill the recess 402 in the dielectric-pair stack 200 and the trench 504 in the TSG deck structure 500, e.g., in a single deposition process.

The plug structure 544 may be formed in direct contact with the channel layer 420. The plug structure 544 may include a first portion, e.g., a lower plug portion formed in the recess 402 in the channel layer 420 under the TSG deck structure 500 and may further include a second portion, e.g., an upper plug portion such as a through-deck portion, extending through the TSG deck structure 500 above the channel layer 420.

In various embodiments, orthographic projections of the upper plug portion of the channel plug structure 544 formed in the trench 504 and the TSG cut structure 550 on a plane parallel to a lateral surface of the dielectric-pair stack 200 are non-overlapped, while orthographic projections of the lower plug portion of the channel plug structure 544 formed in the recess 402 and the TSG cut structure 550 on the plane parallel to the lateral surface of the dielectric-pair stack 200 may or may not overlapped.

As such, by forming the lower plug portion and the through-deck portion in a single step after the TSG deck structure 500 is formed, damages to the lower plug portion and/or the channel layer may be reduced or eliminated to prevent any electrical failure or interference of the channel structure. This is in contrast with related processes, in which a channel plug is formed in the stack structure, a deck structure is formed over the stack structure and the channel plug, followed by an etch process (e.g., a plasma etch or other etch process) to form a channel connection through the deck structure to connect to the channel layer. In this case, the etch process often causes damages at interfaces between the channel plug and the channel connection and/or between the stack structure and the deck structure, resulting in a decrease in the channel saturation current, which in turn causes the failure of the page buffer function of the memory device.

The lower plug portion of the plug structure 544 may be in an end portion of the channel structure, e.g., of the NAND memory string of the memory device, that is away from the substrate 100 in Z-direction as shown in FIG. 7A. The lower plug portion of the plug structure 544 may be in contact with sidewalls of the channel layer 420, that is away from the substrate 100 in z-direction as shown in FIG. 7A.

The plug structure 544 may include semiconductor materials (e.g., polysilicon or an amorphous silicon layer) or conductive materials (e.g., metals). The plug structure 544 may be formed using one or more deposition processes including, e.g., ALD, CVD, PVD, any other suitable processes.

In one embodiment, the plug structure 544 may be made of polysilicon. In another embodiment, the plug structure 544 may include adjoined layers of single crystalline silicon and polysilicon according to various embodiments of the present disclosure. The plug structure 544 may be formed by selectively growing semiconductor materials to surround the sidewalls of channel layer 420 using sidewall selective epitaxial growth (SEG). The plug structure 544 may be controllably doped, e.g., by controlling an ion implantation process.

In some embodiments, the plug structure 544 may include Ti/TiN or Ta/TaN as an adhesion layer and tungsten as a conductor layer filled in both the recess 402 and the trench 504. In some embodiments, the lower plug portion of the plug structure 544 may function as the drain of corresponding NAND memory string.

The plug structure 544 may include airgap(s) 404 formed in the channel structure when the plug structure 544 is formed to fill the recess 402 and the trench 504. An exemplary method to form the air gaps includes the pinch off deposition. In some embodiments, the plug structure 544 may be formed to completely fill the recess 402 and the trench 504 without forming any airgap(s).

According to various embodiments, the plug structure 544 may include various configurations. For example, FIGS. 7B-7C illustrate other exemplary memory structures 700B-700C.

As shown in FIG. 7B, the memory structure 700B may include another exemplary plug structure 544b. Compared with the plug structure 544 in FIG. 7A, the plug structure 544b may include a lower plug portion that is formed over each of a dielectric filling material 430b, a channel layer 420b, and a tunneling layer 416b of functional layer 410b. The functional layer 410b further includes a charge trap layer 414 and a blocking layer 412. The lower plug portion of the plug structure 544b may thus be surrounded by the charge trap layer 414 of the functional layer 410b.

For forming the plug structure 544b, in one embodiment, an opening (e.g., opening 432) may be formed by removing a top portion of each of the dielectric filling material 430, the channel layer 420, and the tunneling layer 416 of functional layer 410 from the channel hole 401, using the charge trap layer 414 as an etch stop layer to form the opening. The opening may be surrounded by the charge trap layer 414 of the functional layer 410b, followed by forming a sacrificial layer to fill the opening. The sacrificial layer may thus be formed above each of the dielectric filling material 430b, the channel layer 420b, and the tunneling layer 416b of functional layer 410, and further surrounded by the charge trap layer 414. The sacrificial layer may further be replaced by the lower plug portion of the plug structure 544b, as shown in FIG. 7B.

A bottom surface of the lower plug portion of the plug structure 544b may be in direct contact with a top surface of the channel layer 420b. In various embodiments, the lower plug portion of the plug structure 544b in FIG. 7B may or may not include airgaps 404b.

In various embodiments, the lower plug portion of the plug structure may be formed further over the charge trap layer and/or blocking layer. For example, as shown in FIG. 7C, the memory structure 700C may include another exemplary plug structure 544c. Compared with the plug structure 544 in FIG. 7A, the plug structure 544c may include a lower plug portion formed over an entire surface of each of a dielectric filling material 430c, a channel layer 420c and a functional layer 410c (including a portion of each of the blocking layer 412, a charge trap layer 414, and a tunneling layer 416).

A bottom surface of the lower plug portion of the plug structure 544c may be in direct contact with a top surface of the channel layer 420c. In various embodiments, the lower plug portion of the plug structure 544c in FIG. 7C may or may not include airgaps 404c.

In various embodiments, the memory device may include one or more memory structures 700A illustrated in FIG. 7A, one or more memory structures 700B illustrated in FIG. 7B, and/or one or more memory structures 700C illustrated in FIG. 7C.

Figure 9:
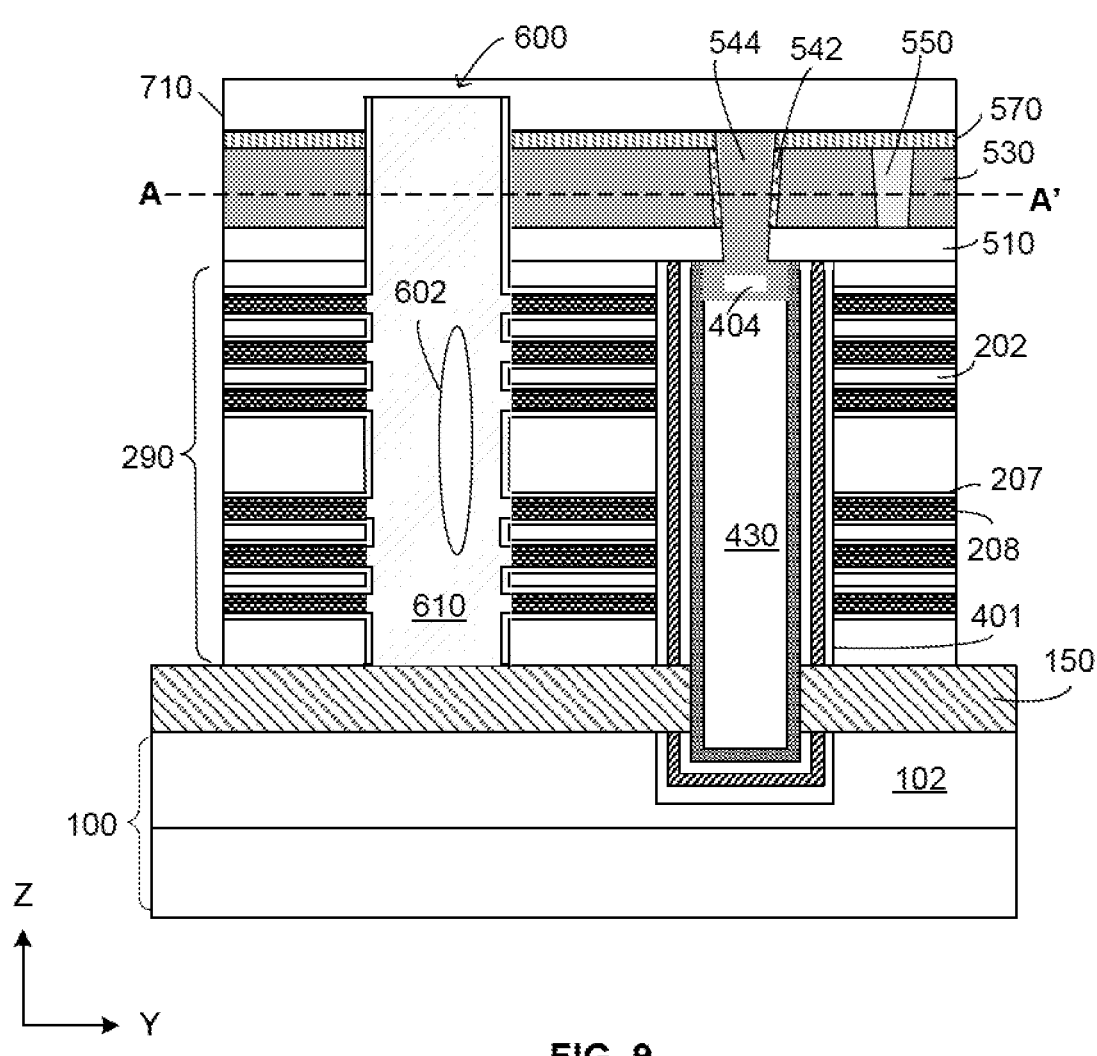
FIG. 9 illustrates another exemplary memory device consistent with various disclosed embodiments of the present disclosure.

FIG. 9 illustrates an exemplary memory structure 900. Referring to FIG. 9, the second dielectric layers 204 of the dielectric-pair stack 200 may be removed and, each second dielectric layer 204 may be replaced by a high K layer 207 and a conductor layer 208 to form a layer stack 290.

For example, the high K layer 207, such as aluminum oxide, may be deposited on surfaces of the cavities exposed after the removal of the second dielectric layer 204, followed by deposition of a layer of an electrically conductive material such as a metal including, e.g., tungsten (W), to fill the cavities remaining after the high K layer 207 is formed. Other suitable materials, such as cobalt (Co), copper (Cu), aluminum (Al), doped silicon, silicides, and/or titanium nitride, may also be used to form the conductor layers 208. Each conductor layer 208 may be formed between the first dielectric layers 202 to form the layer stack 290. In some embodiments, CVD, PVD, ALD, or a combination of two or more of these processes may be used in the deposition processes for forming the high K layer 207 and the conductor layer 208.

Each conductor layer 208 may be configured to electrically connect one or more rows of NAND memory cells along the Y direction or in the X-Y plane and configured as a word line for the memory device. The channel layer 420 formed in the channel hole 401 may be configured to electrically connect a column or a string of NAND memory cells along the Z direction and configured as a bit line for the memory device. As such, a portion of the functional layer 410 in the channel hole 401 in the X-Y plane, as a part of a NAND memory cell, is arranged between conductor layer 208 and channel layer 420, i.e., between a word line and a bit line. A portion of the conductor layer 208 that is around a portion of the channel hole 401 functions as a control gate or gate electrode for a NAND memory cell.

Still in FIG. 9, a slit structure 600 may be formed extending through the layer stack 290 and the TSG deck structure 500. The slit structure 600 may include, e.g., a dielectric material 610 formed in a slit (such as gate line slit) extending through the layer stack 290 and further through the TSG deck structure 500.

The dielectric material 610 may include, for example silicon oxide, silicon nitride, another dielectric material, or a combination thereof. When forming the dielectric material 610, airgap(s) may be formed in the dielectric material 610. In various embodiments, the airgap may be enclosed by the dielectric material filled within a corresponding gate line slit or enclosed by the dielectric material together with one or more sidewalls of the corresponding gate line slit. In some embodiments, the position, dimension, quantity, and shape of the airgap(s) in the slit structure 600 may be designed as desired.

The dielectric material 610 passing through the TSG deck structure 500 may further formed into a dielectric layer 710. The dielectric layer 710 may be formed over the TSG deck structure 500 and covering the entire structure of the layer stack 290.

Figure 10A:
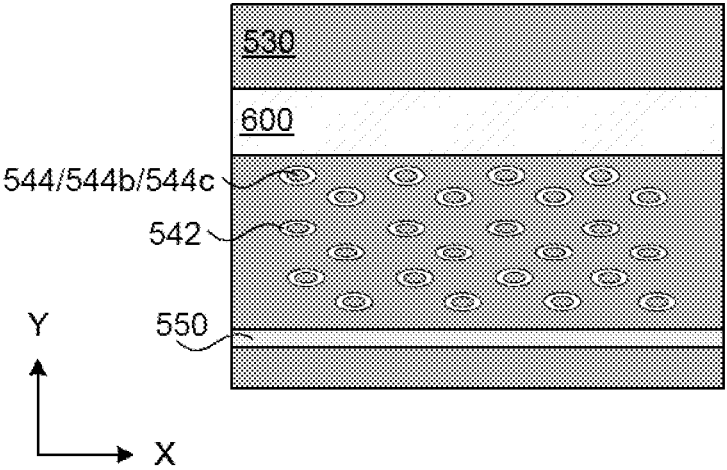
FIGS. 10A-10B illustrate other exemplary memory devices consistent with various disclosed embodiments of the present disclosure.
Figure 10B:
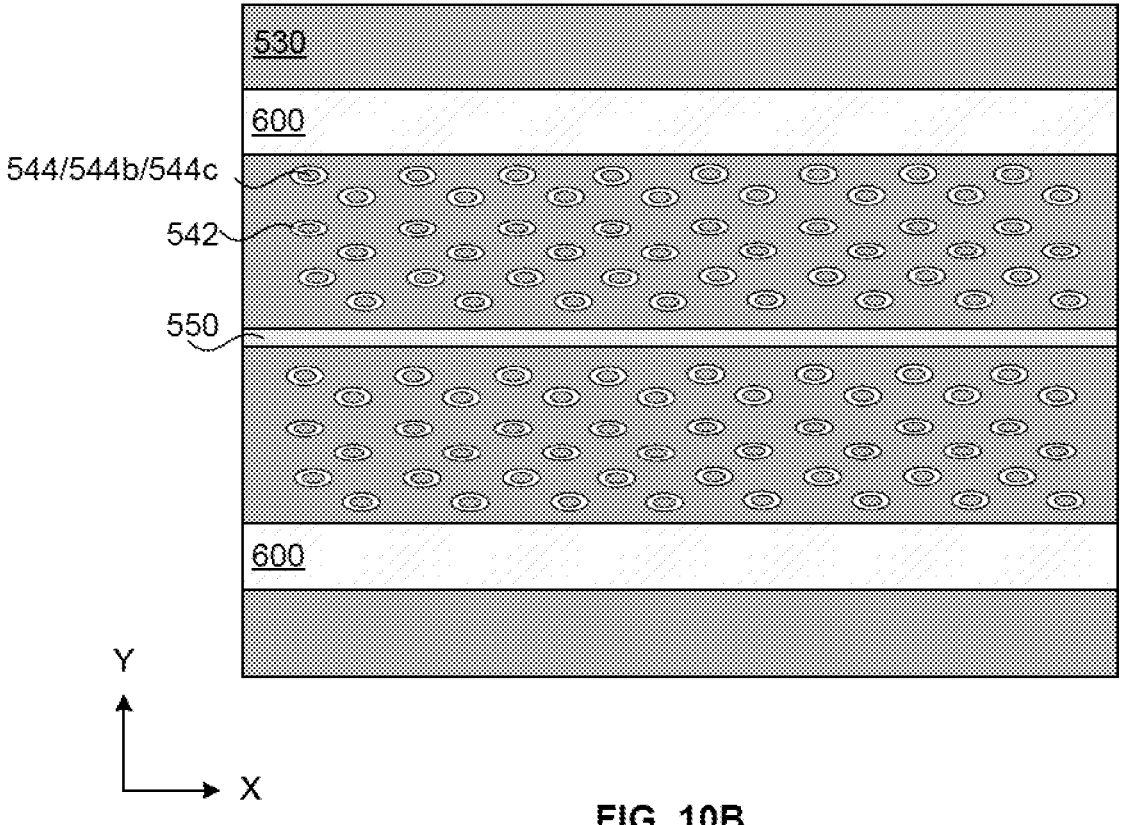

FIGS. 10A-10B illustrate a cross-sectional view of an exemplary memory device consistent with various disclosed embodiments of the present disclosure. FIG. 10A illustrates an A-A' cross-sectional view of the exemplary memory device 900 in FIG. 9, although only one plug structure 344 (corresponding to channel structure 400) is shown in FIG. 9 for illustration purposes.

As shown in FIG. 10A, any number of plug structures 544 (corresponding to memory device 700A), any number plug structures 544b (corresponding to memory device 700B), and/or any number plug structures 544c (corresponding to memory device 700C) may be included between the slit structure 600 and the TSG cut structure 550 along Y-direction.

FIG. 10B illustrates a cross-sectional view of an extended area of the memory device according to various embodiments of the present disclosure. The memory device may include multiple slit structures 600 (e.g., gate line slit structures) and multiple TSG cut structures 550. One or more TSG cut structures 550 may be included between adjacent two slit structures 600 and each TSG cut structure 550 may be formed to separate adjacent plug structures 544/544b/544c (corresponding to channel structures 400) from each other. The slit structures 600 and the TSG cut structures 550 may extend laterally in the X-direction.

For example, an even number N (e.g., 8, 12) rows of plug structures 544/544b/544c (corresponding to channel structures 400) may be arranged in a staggered manner between neighboring slit structures 600. The TSG cut structure 550 may be located to separate rows of channel structures between neighboring slit structures 600 into two equal groups, for example.

In some embodiments, the TSG cut structure 550 can include a strip shape or a wavy shape. In some embodiments, a width of TSG cut structure 550 along Y-direction may be in a range from about 10 nm to about 110 nm, which is less than a diameter (or an equivalent width along Y-direction) or a minimum diameter of the plug structure 544/544b/544c (corresponding to channel structure) in a Y-direction. As such, without occupying the location of a row of channel structures, the TSG cut/TSG cut structure may be arranged between adjacent slit structures. Further, the TSG cut/TSG cut structures are formed in a TSG deck structure formed completely over the dielectric-pair stack/layer stack, rather than being formed within a top layer or a top portion (e.g., the first dielectric layer 202, the second dielectric layer 204, the high K layer 207, and/or the conductor layer 208) of the dielectric-pair stack/layer stack, die size along Y-direction or bit line direction of the 3D memory device may thus be reduced, with improved area utilization of wafers and reduced production cost.

Figure 11:
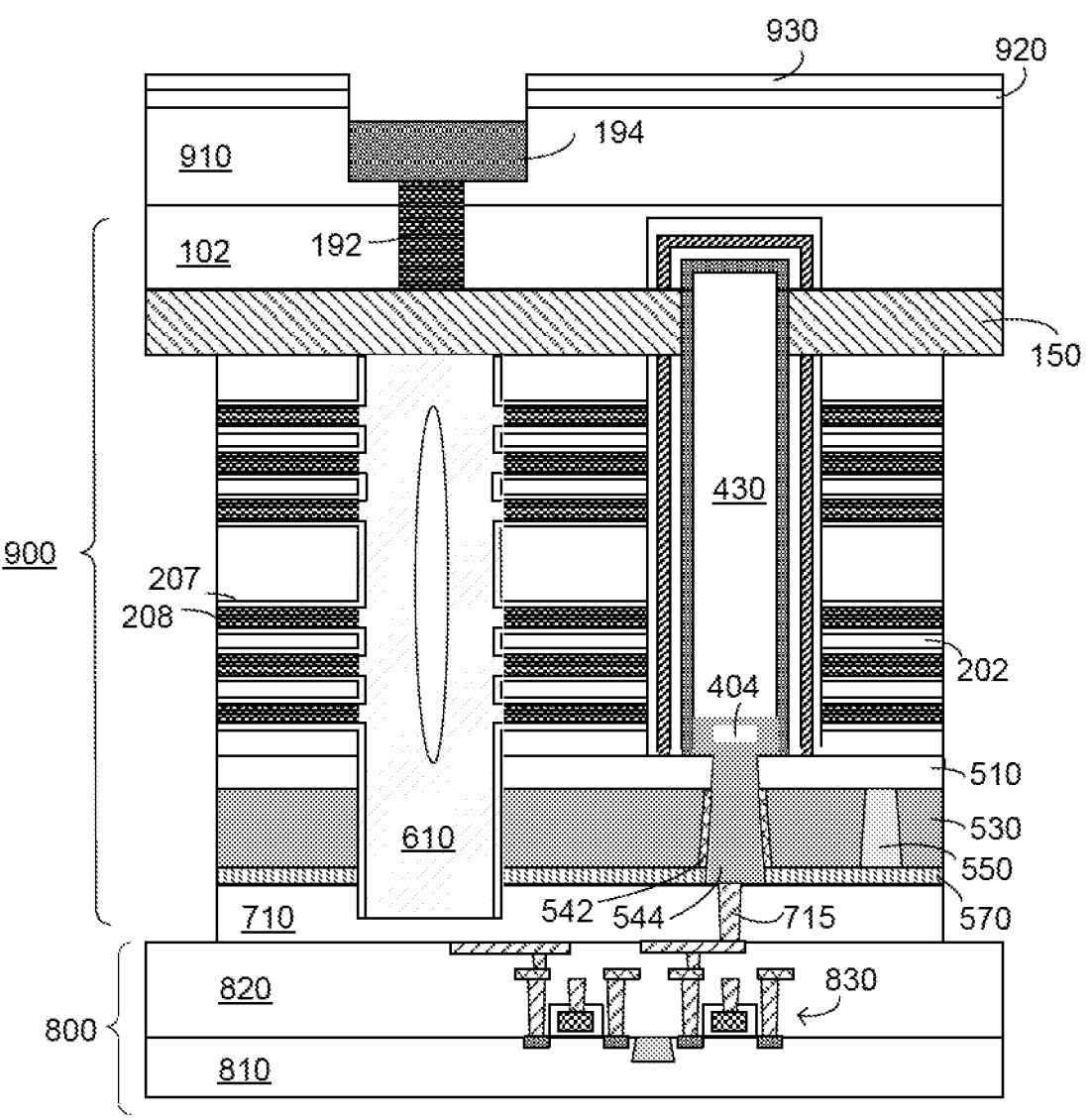
FIG. 11 illustrates another exemplary memory device consistent with various disclosed embodiments of the present disclosure.

Referring to FIG. 11, the memory device may further include a peripheral device 800 that is configured for controlling signals to and from the array structure, e.g., as shown in FIGS. 10A-10B.

The peripheral device 800 may include a substrate 810 including, e.g., single crystalline silicon, Ge, SiGe, SiC, SOI, GOI, polysilicon, or a Group III-V compound such as GaAs or InP. Peripheral circuits 830 (e.g., control circuits) may be formed in a dielectric layer 820 over the substrate 810, and used for facilitating the operation of the memory device. For example, the peripheral circuits 830 may include metal-oxide-semiconductor field-effect transistors (MOSFETs) and provide functional devices such as page buffers, sense amplifiers, column decoders, and row decoders.

The memory structure 900 (or array structure) and peripheral device 800 may be bonded, e.g., by a flip-chip bonding method. For example, the memory structure 900 may be flipped in a z-direction to bond and electrically connect with the 830 via contact 715 formed in the dielectric layer 710.

The substrate 100 of the memory structure 900 may be thinned by a thinning process, such as wafer grinding, dry etch, wet etch, CMP, or a combination thereof. The doped region 102 of the substrate 100 may then exposed, followed by forming a dielectric layer 910 over the doped region 102. A conductive layer 920 (such as Cu, W, Co, Cu, and/or Al) may be formed over the dielectric layer 910, and a polymeric substrate 930 (such as polyimide) may be formed over the conductive layer 920. A pad opening may be formed, such that a first pad structure 192 (e.g., polysilicon) is formed in the doped region 102 and a second pad structure 194 is formed in the dielectric layer 910 and connecting the first pad structure 192. The second pad structure 194 may include a top surface lower than the conductive layer 920.

In some embodiments, the disclosed memory device may include the memory/array structure and multiple peripheral devices. The multiple peripheral devices (or 3D array devices) may be bonded with a corresponding 3D array device (or a corresponding peripheral device) sequentially in separate bonding processes. In some other embodiments, the multiple peripheral devices (or 3D array devices) may be bonded with a corresponding 3D array device (or a corresponding peripheral device) simultaneously in one boding process. In other embodiments, the memory device may include a peripheral device and multiple 3D array devices that are the same as or similar.

As disclosed, air gaps may be designed and configured in the slit structures, the plug structures, and/or dielectric filling materials of the channel structure of the disclosed memory device with desired positions, dimensions, quantities, and shapes, e.g., to reduce wafer bow to improve quality of the formed memory devices.

Figure 12:
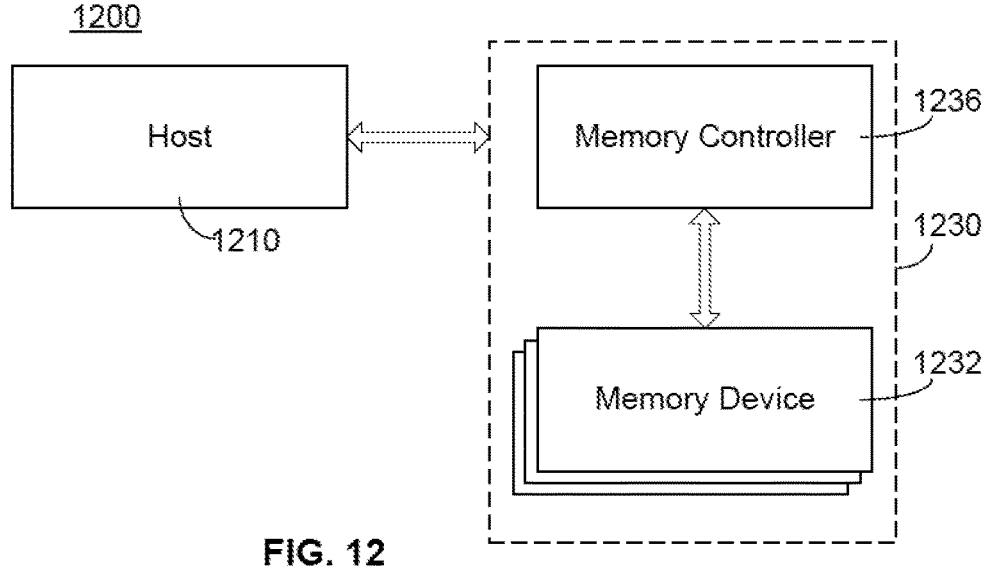
FIG. 12 illustrates an exemplary memory system consistent with various disclosed embodiments of the present disclosure.

FIG. 12 illustrates an exemplary memory system 1200 according to various embodiments of the present disclosure. In various embodiments, the memory system 1200 may be a mobile phone (e.g., a smartphone), a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein.

As shown in FIG. 12, the memory system 1200 may include a host 1210 and a memory system 1230 including one or more memory devices 1232 and a memory controller 1236. The host 1210 may be a processor of an electronic device, such as a central processing unit (CPU), or a system-on-chip (SoC), such as an application processor (AP). The host 1210 may be configured to send or receive data to or from the memory devices 1232.

The memory controller 1236 is coupled to the memory devices 1232 and host 1210 and is configured to control the memory devices 1232, according to some embodiments of the present disclosure. The memory controller 1236 may manage the data stored in the memory devices 1232 and communicate with the host 1210. In some embodiments, the memory controller 1236 is designed for operating in a low duty-cycle environment, including, for example, secure digital (SD) cards, compact Flash (CF) cards, universal serial bus (USB) Flash drives, or other media for use in electronic devices, such as personal computers, digital cameras, mobile phones, etc. In some other embodiments, the memory controller 1236 is designed for operating in a high duty-cycle environment, such as solid-state drives (SSDs) or embedded multi-media-cards (eMMCs) used as data storage for mobile devices, such as smartphones, tablets, laptop computers, etc., and enterprise storage arrays. The memory controller 1236 may be configured to control operations of the memory device 1232, such as read, erase, and program operations.

The memory controller 1236 may also be configured to manage various functions with respect to the data stored or to be stored in the memory device 1232 including, but not limited to bad-block management, garbage collection, logical-to-physical address conversion, wear leveling, etc. In some embodiments, the memory controller 1236 is further configured to process error correction codes (ECCs) with respect to the data read from or written to the memory device 1232. Any other suitable functions may be performed by the memory controller 1236 as well, for example, formatting the memory device 1232. The memory controller 1236 may communicate with an external device (e.g., the host 1210) according to a particular communication protocol. For example, the memory controller 1236 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

The memory device 1232 may be any memory device disclosed in the present disclosure. The memory controller 1236 and one or more memory devices 1232 may be integrated into various types of storage devices, for example, in a same package, such as a universal Flash storage (UFS) package or an eMMC package. The memory system 1200 may be implemented and packaged into different types of end electronic products.

Figure 13:
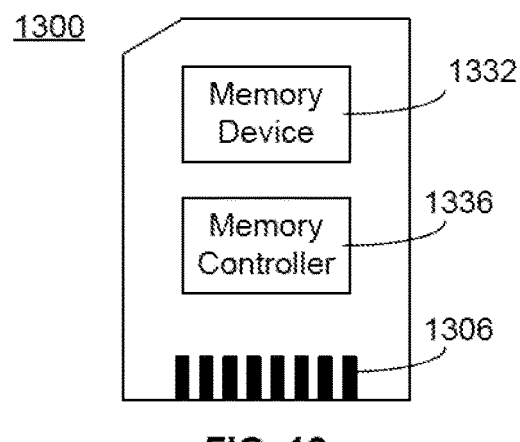
FIG. 13 illustrates an exemplary memory card including a memory device consistent with various disclosed embodiments of the present disclosure.
Figure 14:
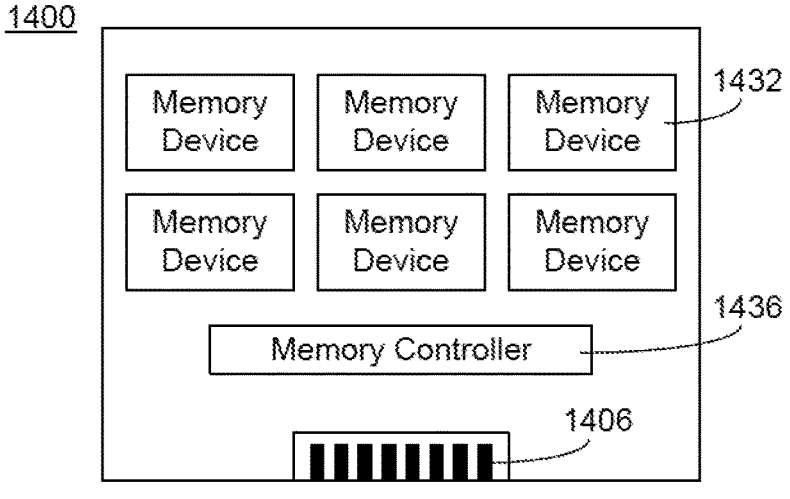
FIG. 14 illustrates an exemplary solid-state drive (SSD) including memory device consistent with various disclosed embodiments of the present disclosure.

FIGS. 13 and 14 illustrate an exemplary memory card 1300 and SSD 1400, respectively, according to various embodiments of the present disclosure.

As shown in FIG. 13, a memory controller 1336 and a single memory device 1332 may be integrated into the memory card 1300. The memory device 1332 may be any memory device disclosed herein. The memory card 1300 may include a PC card (personal computer memory card international association (PCMCIA)), a CF card, a smart media (SM) card, a memory stick, a multimedia card (MMC, RS-MMC, or MMCmicro), an SD card (SD, miniSD, microSD, or SDHC), a UFS, etc.

The memory card 1300 may further include a memory card connector 1306 configured to couple the memory card 1300 to a host (e.g., the host 1210 shown in FIG. 12).

As shown in FIG. 14, a memory controller 1436 and multiple memory devices 1432 may be integrated into the SSD 1400. The memory devices 1432 may be any memory device disclosed herein. The SSD 1400 may further include an SSD connector 1406 configured to couple the SSD 1400 to a host (e.g., the host 1210 shown in FIG. 12). In some embodiments, the storage capacity and/or the operation speed of the SSD 1400 is greater than those of the memory card 1300.

The above detailed descriptions only illustrate certain exemplary embodiments of the present disclosure, and are not intended to limit the scope of the present disclosure. Those skilled in the art may understand the specification as a whole, and technical features in the various embodiments may be combined into other embodiments understandable to those persons of ordinary skill in the art. Any equivalent or modification thereof, without departing from the spirit and principle of the present disclosure, falls within the true scope of the present disclosure.

What is claimed is:

1. A memory device comprising:
a stack structure;
a semiconductor layer over the stack structure and containing a top selective gate (TSG) cut structure;
a channel plug structure passing through the semiconductor layer, and penetrating into the stack structure and in contact with a channel layer, the channel layer extending through the stack structure;
a barrier layer through the semiconductor layer and separating the channel plug structure from the semiconductor layer along a lateral direction of the semiconductor layer; and
slit structures extending through the stack structure and laterally arranged in parallel, wherein
the TSG cut structure is in parallel with the slit structures laterally and separates a plurality of channel plug structures configured between the slit structures into groups.

2. The memory device according to claim 1, further comprising:
a deck structure comprising:
a dielectric layer over the stack structure, a deck cap layer, and the semiconductor layer between the dielectric layer and the deck cap layer, wherein the channel plug structure further passes through the dielectric layer and the deck cap layer.

3. The memory device according to claim 1, wherein the channel plug structure includes an upper plug portion through the semiconductor layer and a lower plug portion in the stack structure, and at an interface between the upper and lower plug portions, the upper plug portion includes a width less than the lower plug portion.

4. The memory device according to claim 1, wherein a lower plug portion of the channel plug structure is in contact with the channel layer, and the lower plug portion includes a sidewall surrounded by the channel layer or includes a bottom surface on the channel layer.

5. The memory device according to claim 1, further comprising:

a channel structure extending through the stack structure and comprising a functional layer between the channel layer and the stack structure, the functional layer comprising:

a tunneling layer adjacent to the channel layer, a blocking layer adjacent to the stack structure, and a charge trap layer between the blocking layer and the tunneling layer, wherein a lower plug portion of the channel plug structure is formed above the channel layer and the tunneling layer, and further surrounded by the charge trap layer.

6. The memory device according to claim 1, wherein the TSG cut structure is between an upper plug portion of the channel plug structure and an adjacent upper plug portion of an adjacent channel plug structure along the lateral direction of the semiconductor layer.

7. The memory device according to claim 1, wherein the channel plug structure contains an airgap under the semiconductor layer.

8. The memory device according to claim 1, wherein the stack structure comprises a dielectric-pair stack or a stack structure comprising alternating layers of a conductor layer and a dielectric layer.

9. The memory device according to claim 1, wherein the TSG cut structure has a thickness same as the semiconductor layer along a vertical direction.

10. The memory device according to claim 1, wherein the TSG cut structure separates from the stack structure by a dielectric layer over the stack structure.

11. The memory device according to claim 1, further comprising:

a dielectric filling material under the channel plug structure, passing through the stack structure, and surrounded by the channel layer.

12. The memory device according to claim 1, wherein the barrier layer has a thickness same as the semiconductor layer along a vertical direction.

13. A method for forming the memory device according to claim 11, comprising:

providing a dielectric-pair stack containing the channel layer extending there-through, and forming a sacrificial layer in the dielectric-pair stack and in contact with the channel layer;

forming the semiconductor layer over the dielectric-pair stack, the semiconductor layer containing the top selective gate (TSG) cut structure;

forming a trench through the semiconductor layer to expose the sacrificial layer;

forming the barrier layer on sidewalls of the semiconductor layer exposed by the trench;

forming a recess by removing the sacrificial layer; and forming the channel plug structure in the trench and the recess.

14. The method according to claim 13, wherein the channel plug structure includes an upper plug portion formed in the trench and a lower plug portion formed in the recess, and at an interface between the upper and lower plug portions, the upper plug portion includes a width less than the lower plug portion.

15. The method according to claim 13, wherein the sacrificial layer is formed in the dielectric-pair stack either having a sidewall surrounded by the channel layer or having a bottom surface over the channel layer.

16. The method according to claim 13, wherein forming the barrier layer comprises:

performing an oxidation process to convert a portion of the sidewalls of the semiconductor layer exposed by the trench into the barrier layer; or depositing the barrier layer selectively on the sidewalls of the semiconductor layer exposed by the trench.

17. The method according to claim 13, wherein a deck structure is formed over the dielectric-pair stack, the deck structure comprising:

a dielectric layer, a deck cap layer; and the semiconductor layer, the barrier layer, and the TSG cut structure, that are between the dielectric layer and the deck cap layer.

18. The method according to claim 13, wherein forming the channel plug structure further comprises:

forming an airgap in a portion of the channel plug structure under the semiconductor layer.

19. The memory device according to claim 1, wherein the TSG cut structure is made of a material including a dielectric layer, and the channel plug structure is made of a material comprising polysilicon.

20. A memory system comprising:

a controller, and a memory device comprising:

a stack structure;

a semiconductor layer over the stack structure and containing a top selective gate (TSG) cut structure;

a channel plug structure passing through the semiconductor layer, and penetrating into the stack structure and in contact with a channel layer, the channel layer extending through the stack structure;

a barrier layer through the semiconductor layer and separating the channel plug structure from the semiconductor layer along a lateral direction of the semiconductor layer; and slit structures extending through the stack structure and laterally arranged in parallel, wherein the TSG cut structure is in parallel with the slit structures laterally and separates a plurality of channel plug structures configured between the slit structures into groups, wherein the controller is configured to control the memory device.

\* \* \* \* \*